(12) United States Patent
Chang et al.

(10) Patent No.: US 10,121,787 B2
(45) Date of Patent: Nov. 6, 2018

(54) METHODS FOR FABRICATING FIN FIELD EFFECT TRANSISTORS

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/706,760

(22) Filed: Sep. 17, 2017

(65) Prior Publication Data

US 2018/0026033 A1    Jan. 25, 2018

Related U.S. Application Data

(62) Division of application No. 15/071,224, filed on Mar. 16, 2016, now Pat. No. 9,768,170.
(Continued)

(51) Int. Cl.
| | |
|---|---|
| *H01L 21/82* | (2006.01) |
| *H01L 27/088* | (2006.01) |
| *H01L 29/06* | (2006.01) |
| *H01L 21/8234* | (2006.01) |
| *H01L 29/66* | (2006.01) |

(52) U.S. Cl.
CPC .. *H01L 27/0886* (2013.01); *H01L 21/823431* (2013.01); *H01L 21/823481* (2013.01); *H01L 29/0649* (2013.01); *H01L 29/66545* (2013.01); *H01L 21/823437* (2013.01)

(58) Field of Classification Search
CPC . H01L 21/28; H01L 21/82; H01L 21/823431; H01L 27/0886; H01L 27/0924; H01L 27/10826; H01L 27/10879; H01L 27/3223; H01L 29/0649; H01L 21/823481; H01L 21/83878; H01L 21/764; H01L 21/76264; H01L 21/7682; H01L 21/02;
(Continued)

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

*Primary Examiner* — Chuong A Luu
(74) *Attorney, Agent, or Firm* — JCIPRNET

(57) ABSTRACT

Method for fabricating Fin field effect transistors (FinFETs) are disclosed. One of the methods includes the following steps. A first semiconductor fin, a second semiconductor fin and an insulator between the first semiconductor fin and the second semiconductor fin are formed. A first dummy gate, a second dummy gate and an opening between the first and second dummy gates are formed over the insulator, wherein the first dummy gate and the second dummy gate cross over portions of the first semiconductor fin and the second semiconductor fin respectively. A dielectric layer is formed in the opening, wherein the dielectric layer comprises an air gap therein. The first dummy gate and the second dummy gate are replaced with a first gate and a second gate, wherein the first gate and the second gate are electrically insulated by the dielectric layer comprising the air gap therein.

20 Claims, 14 Drawing Sheets

Related U.S. Application Data

(60) Provisional application No. 62/291,522, filed on Feb. 5, 2016.

(58) Field of Classification Search
CPC ..... H01L 21/823412; H01L 21/823418; H01L 21/8234
USPC ......................................................... 257/401
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2015/0303118 A1* | 10/2015 | Wang ............... H01L 21/823481 257/401 |

* cited by examiner

METHODS FOR FABRICATING FIN FIELD EFFECT TRANSISTORS

CROSS-REFERENCE TO RELATED APPLICATION

This application is a divisional of and claims the priority benefit of U.S. application Ser. No. 15/071,224, filed on Mar. 16, 2016 now U.S. Pat. No. 9,768,170, now allowed, which claims the priority benefit of U.S. provisional application Ser. No. 62/291,522, filed on Feb. 5, 2016. The entirety of each of the above-mentioned patent applications is hereby incorporated by reference herein and made a part of specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
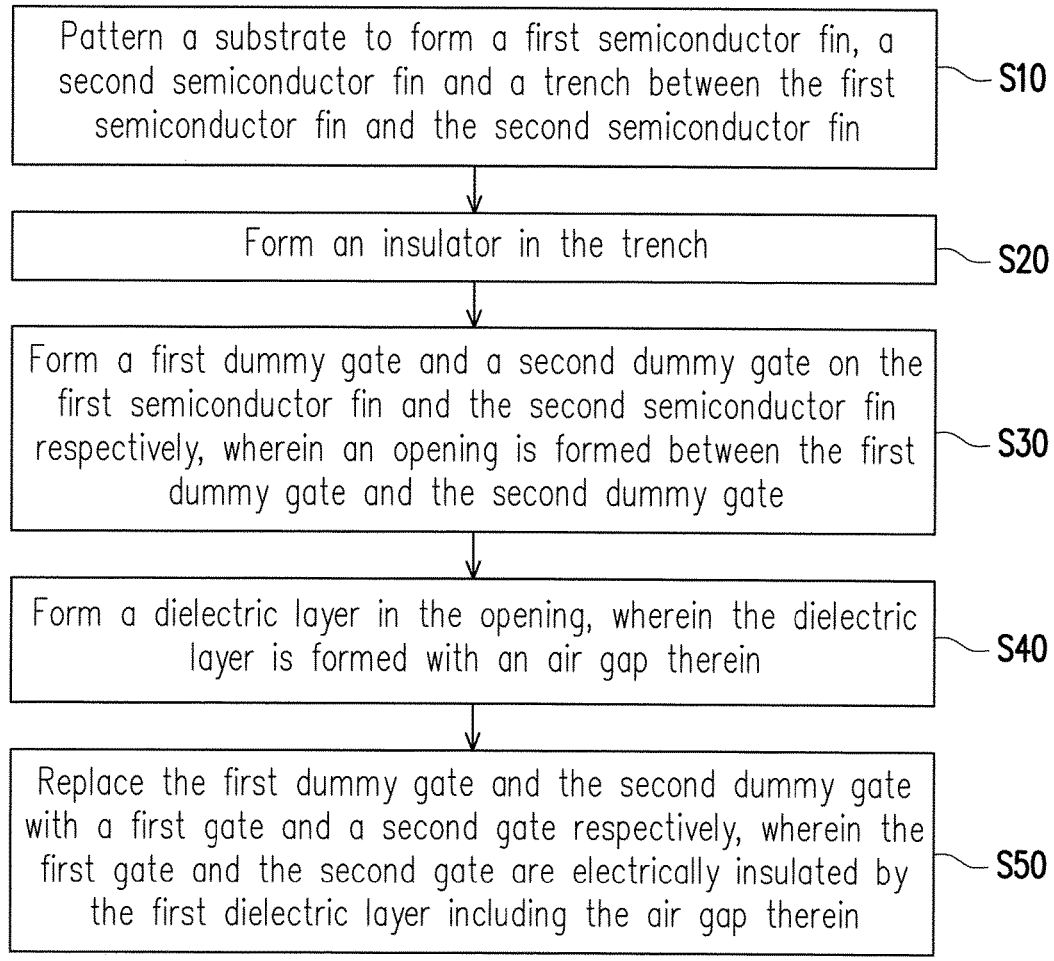
FIG. 1 illustrates a flow chart illustrating a method for fabricating a FinFET in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is fouled over a substrate and patterned using a photolithography process. Spacers are formed alongside the patterned sacrificial layer using a self-aligned process. The sacrificial layer is then removed, and the remaining spacers may then be used to pattern the fins.

FIG. 1 illustrates a flow chart illustrating a method for fabricating a FinFET in accordance with some embodiments of the present disclosure. Referring to FIG. 1, the method at least includes Step S10, Step S20, Step S30, Step S40 and Step S50. First, in Step S10, a substrate is patterned to form a first semiconductor fin, a second semiconductor fin and a trench between the first semiconductor fin and the second semiconductor fin. Then, in Step S20, an insulator is formed in the trench. In Step S30, a first dummy gate and a second dummy gate are formed on the first semiconductor fin and the second semiconductor fin respectively, wherein an opening is formed between the first dummy gate and the second dummy gate. In Step S40, a dielectric layer is formed in the opening, wherein the dielectric layer is formed with an air gap therein. In Step S50, the first dummy gate and the second dummy gate are replaced with a first gate and a second gate respectively, wherein the first gate and the second gate are electrically insulated by the first dielectric layer including the air gap therein.

Figure 2A:
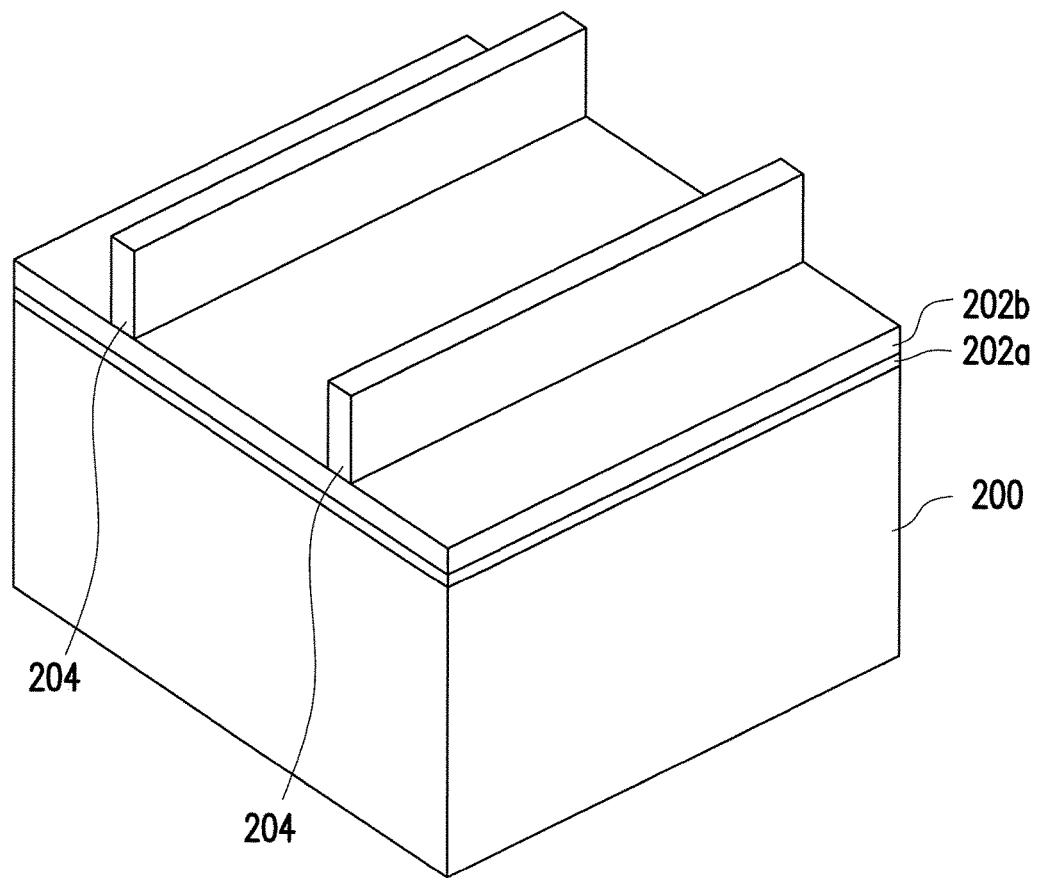
FIGS. 2A-2L are perspective views of a method for fabricating a FinFET in accordance with some embodiments of the present disclosure.

FIG. 2A is a perspective view of the FinFET at one of various stages of the fabricating method. In Step 10 in FIG. 1 and as shown in FIG. 2A, a substrate 200 is provided. In some embodiments, the substrate 200 includes a group IV element or a group III-V semiconductor compound, such as Si, Ge, SiGe, GaAs, InAs, InGaAs, or the like. In some embodiments, the substrate 200 includes silicon substrate, a silicon-on-insulator (SOI) substrate, or a substrate formed of other suitable semiconductor materials. Depending on the requirements of design, the substrate 100 may be a P-type substrate or an N-type substrate and may have doped regions therein. The doped regions may be configured for an N-type FinFET device or a P-type FinFET device.

In some embodiments, a pad layer 202a and a mask layer 202b are sequentially formed on the substrate 200. The pad layer 202a may be a silicon oxide thin film formed, for example, by thermal oxidation process. The pad layer 202a may act as an adhesion layer between the substrate 200 and mask layer 202b. The pad layer 202a may also act as an etch stop layer for etching the mask layer 202b. In at least one embodiment, the mask layer 202b is a silicon nitride layer formed, for example, by low-pressure chemical vapor deposition (LPCVD) or plasma enhanced chemical vapor deposition (PECVD). The mask layer 202b is used as a hard mask during subsequent photolithography processes. Then, a patterned photoresist layer 204 having predetermined patterns is formed on the mask layer 202b.

Figure 2B:
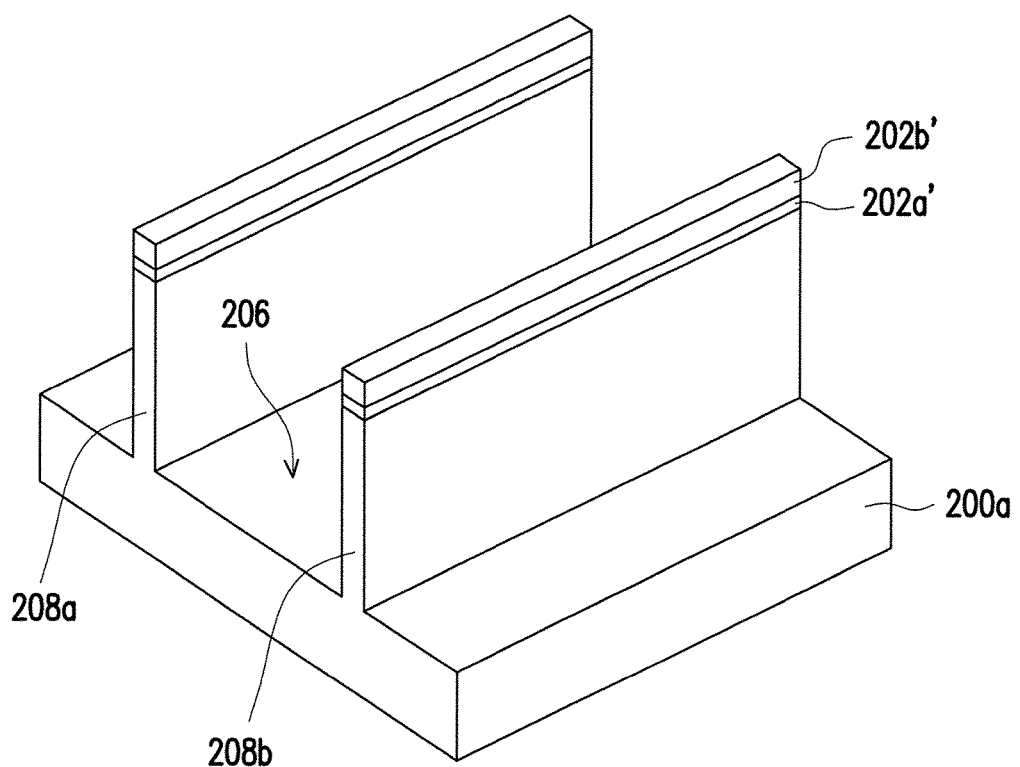

FIG. 2B is a perspective view of the FinFET at one of various stages of the fabricating method. In Step S10 in FIG. 1 and as shown in FIGS. 2A-2B, the mask layer 202b and the pad layer 202a which are not covered by the patterned photoresist layer 204 are sequentially etched to form a patterned mask layer 202b' and a patterned pad layer 202a' so as to expose underlying substrate 200. Then, by using the patterned mask layer 202b', the patterned pad layer 202a' and the patterned photoresist layer 204 as a mask, portions of the substrate 200 are exposed and removed to form a first semiconductor fin 208a and a second semiconductor fin 208b and a trench 206 between the first semiconductor fin 208a and the second semiconductor fin 208b. After the substrate 200 is patterned, the first semiconductor fin 208a and the second semiconductor fin 208b are covered by the patterned mask layer 202b', the patterned pad layer 202a' and the patterned photoresist layer 204.

The widths of the first semiconductor fin 208a and the second semiconductor fin 208b are, for example, smaller than about 30 nm, respectively. The heights of the first semiconductor fin 208a and the second semiconductor fin 208b range from about 5 nm to about 500 nm, respectively. After the trench 206 and the first semiconductor fin 208a and the second semiconductor fin 208b are formed, the patterned photoresist layer 204 is then removed. In some embodiments, a cleaning process may be performed to remove a native oxide of the semiconductor substrate 200a and the first semiconductor fin 208a and the second semiconductor fin 208b. The cleaning process may be performed using diluted hydrofluoric (DHF) acid or other suitable cleaning solutions.

Figure 2C:
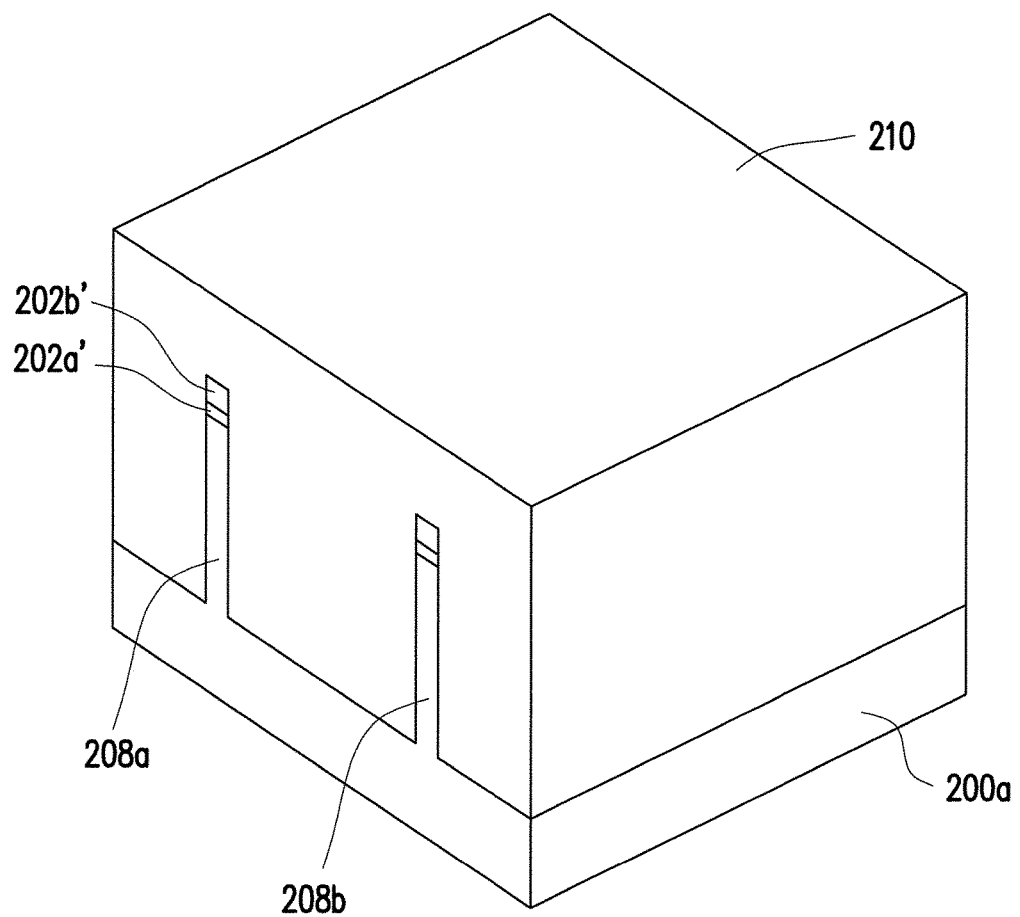

FIG. 2C is a perspective view of the FinFET at one of various stages of the fabricating method. In Step S20 in FIG. 1 and as shown in FIGS. 2B-2C, an insulating material 210 is formed over the substrate 200a to cover the first semiconductor fin 208a and the second semiconductor fin 208b and fills up the trench 206. In addition to the first semiconductor fin 208a and the second semiconductor fin 208b, the insulating material 210 further covers the patterned pad layer 202a' and the patterned mask layer 202b', for example. The insulating material 210 may include silicon oxide, silicon nitride, silicon oxynitride, a spin-on dielectric material, or a low-K dielectric material. The insulating material 210 may be formed by high-density-plasma chemical vapor deposition (HDP-CVD), sub-atmospheric CVD (SACVD) or by spin-on.

Figure 2D:
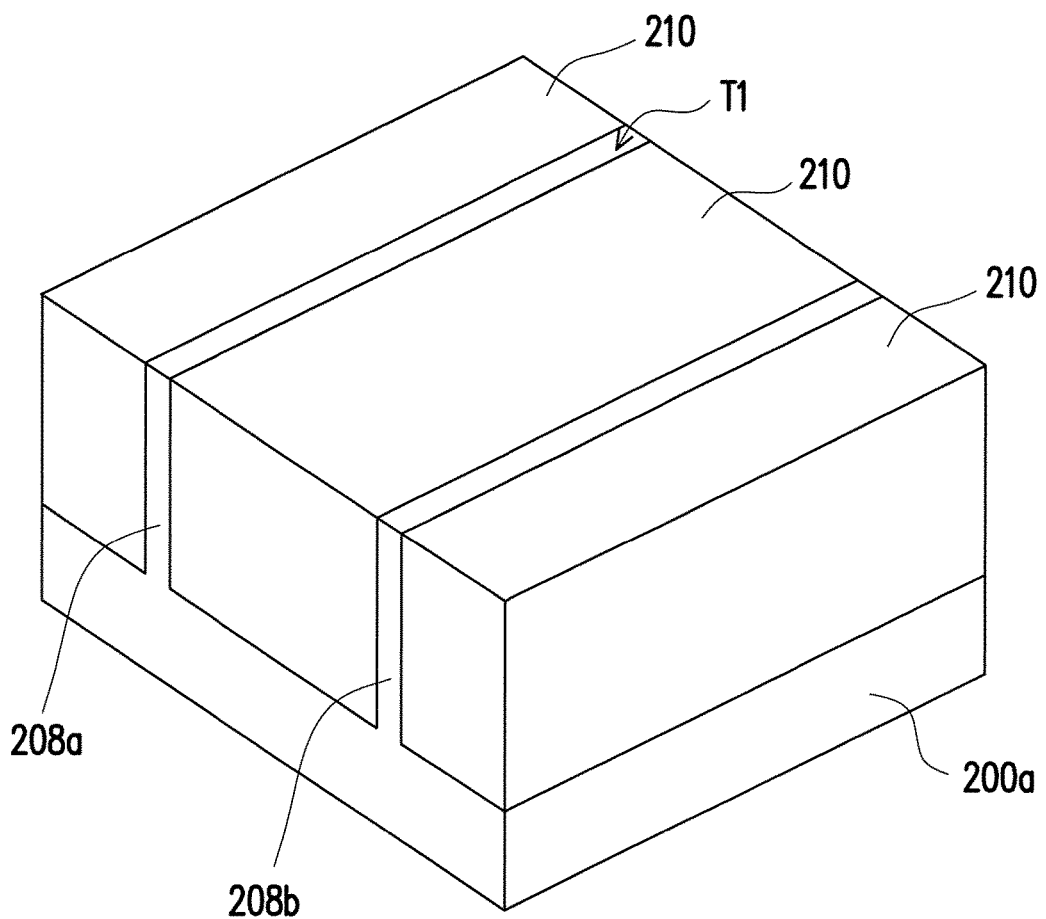

FIG. 2D is a perspective view of the FinFET at one of various stages of the fabricating method. In Step S20 in FIG. 1 and as shown in FIGS. 2C-2D, a polish process such as chemical mechanical polish process is, for example, performed to remove a portion of the insulating material 210, the patterned mask layer 202b' and the patterned pad layer 202a' until the first semiconductor fin 208a and the second semiconductor fin 208b are exposed. As shown in FIG. 2D, after the insulating material 210 is polished, top surfaces of the polished insulating material 210 is substantially coplanar with top surfaces T1 of the first semiconductor fin 208a and the second semiconductor fin 208b.

Figure 2E:
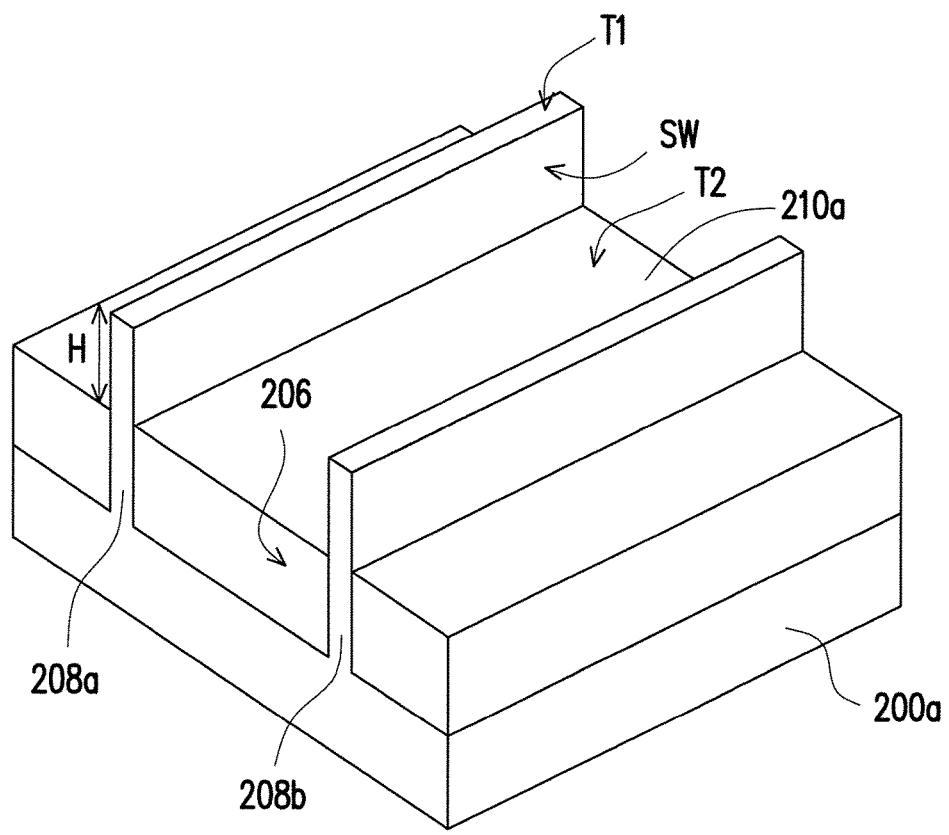

FIG. 2E is a perspective view of the FinFET at one of various stages of the fabricating method. In Step S20 in FIG. 1 and as shown in FIGS. 2D-2E, the polished insulating material 210 filled in the trench 206 is partially removed by an etching process such that an insulator 210a is formed on the substrate 200a and located between the first semiconductor fin 208a and the second semiconductor fin 208b. In some embodiments, the etching process may be a wet etching process with hydrofluoric acid (HF) or a dry etching process. The top surface T2 of the insulator 210a is lower than the top surfaces T1 of the first semiconductor fin 208a and the second semiconductor fin 208b. In other words, the first semiconductor fin 208a and the second semiconductor fin 208b protrude from the top surface T2 of the insulator 210a and sidewalls SW of the first semiconductor fin 208a and the second semiconductor fin 208b are thus exposed. The height difference between the top surfaces T1 of the first semiconductor fin 208a and the second semiconductor fin 208b and the top surface T2 of the insulator 210a is H, and the height difference H ranges from about 15 nm to about 50 nm. The insulator 210a partially covers sidewalls of the first semiconductor fin 208a and the second semiconductor fin 208b.

Figure 2F:
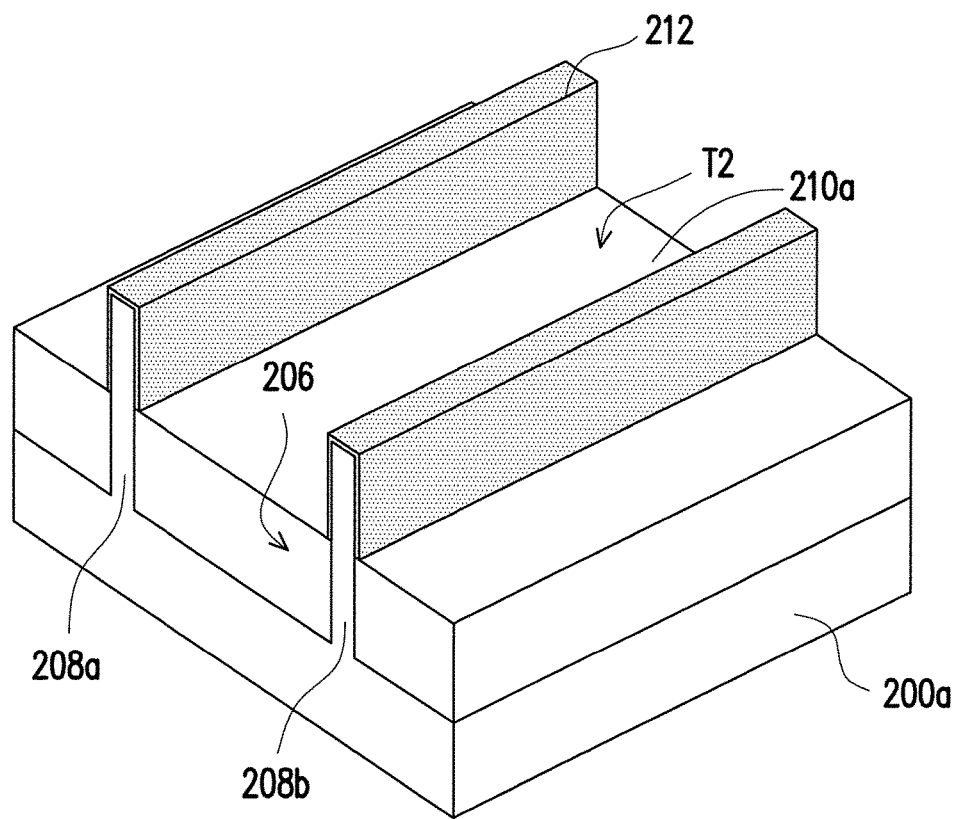

FIG. 2F is a perspective view of the FinFET at one of various stages of the fabricating method. In Step S30 in FIG. 1 and as shown in FIGS. 2E-2F, after the insulator 210a is framed, a dielectric layer 212 is formed to conformally cover the top surfaces T1 and the sidewalls SW of the first semiconductor fin 208a and the second semiconductor fin 208b, for example. In alternative embodiments, the dielectric layer 212 further conformally covers the top surface T1 of the insulator 210a. In some embodiments, the dielectric layer 212 may include silicon oxide, silicon nitride or silicon oxy-nitride. In some embodiments, the dielectric layer 212 is a high-k dielectric layer with a thickness in the range of about 0.2 nm to 5 nm. The dielectric layer 212 may be formed by a suitable process such as atomic layer deposition (ALD), chemical vapor deposition (CVD), physical vapor deposition (PVD), thermal oxidation or UV-ozone oxidation.

Figure 2G:
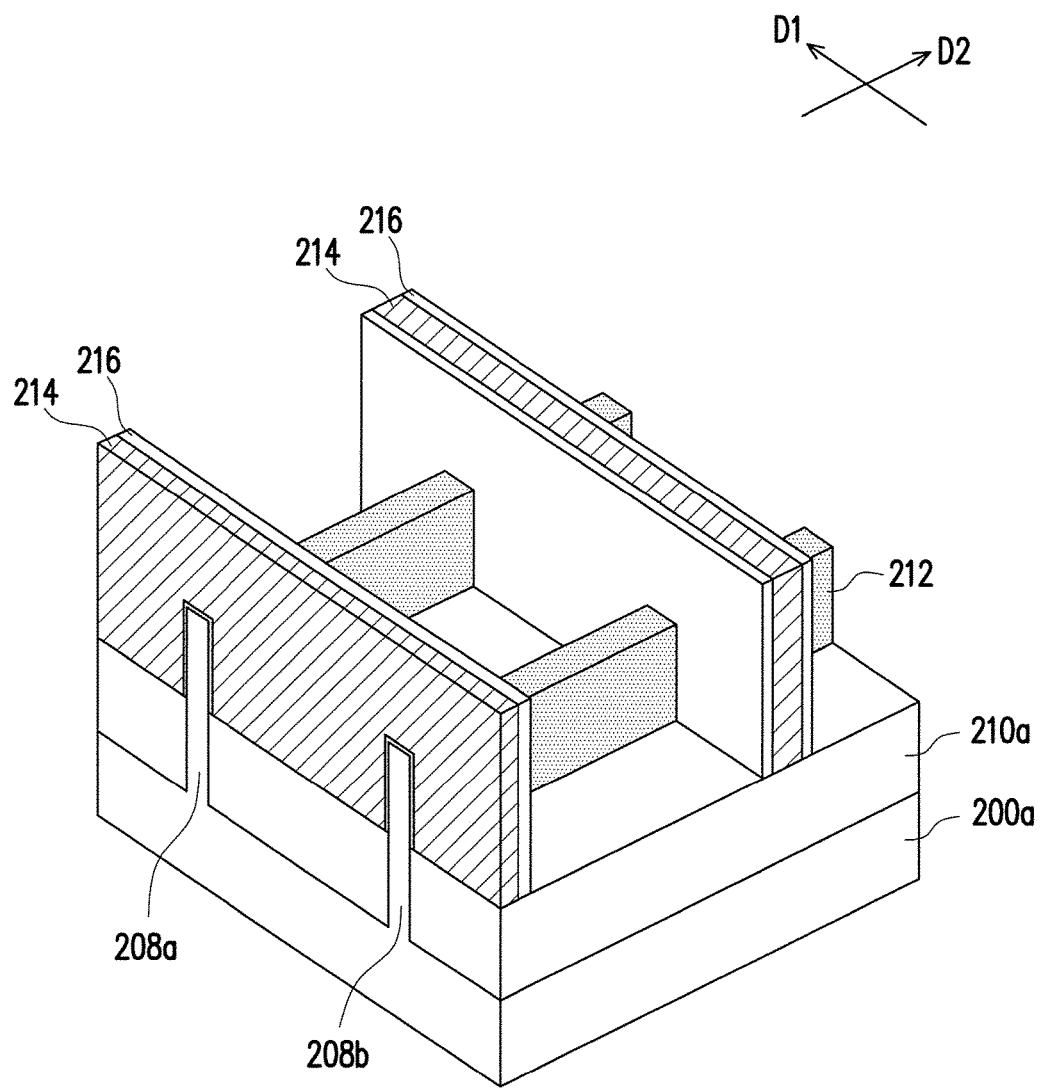

FIG. 2G is a perspective view of the FinFET at one of various stages of the fabricating method. In Step S30 in FIG. 1 and as shown in FIGS. 2F-2G, a dummy gate strip 214 is formed on the first semiconductor fin 208a and the second semiconductor fin 208b, wherein a lengthwise direction D1 of the dummy gate strip 214 is different from lengthwise directions D2 of the first semiconductor fin 208a and the second semiconductor fin 208b. The lengthwise direction D1 of the dummy gate strip 214 is perpendicular to the lengthwise directions D2 of the first semiconductor fin 208a and the second semiconductor fin 208b, for example. Two dummy gate strips 214 shown in FIG. 2G are merely for illustration, in alternative embodiments, more dummy gate strips 214 may be formed in accordance with actual design requirements. The dummy gate strip 214 includes a silicon-containing material, such as poly-silicon, amorphous silicon or a combination thereof. The dummy gate strip 214 may be formed by a suitable deposition process such as chemical vapor deposition (CVD) and physical vapor deposition (PVD) and a suitable planarization process such as chemical mechanical polish. In some embodiments, the width of the dummy gate strip 214 ranges from 5 nm to 50 nm.

In some embodiments, after the dummy gate strip 214 is formed, a pair of spacers 216 is formed on sidewalls of the dummy gate strip 214. The spacers 216 is formed on the insulator 210a and extends along the sidewalls of the dummy gate strip 214. The spacers 216 are formed of dielectric materials, such as silicon nitride or SiCON. The spacers 216 may include a single layer or multilayer structure. Since the pair of spacers 216 is spaced apart by the dummy gate strip 214, a gap between the pair of spacers 216 substantially equals to the width of the dummy gate strip 214.

Figure 2H:
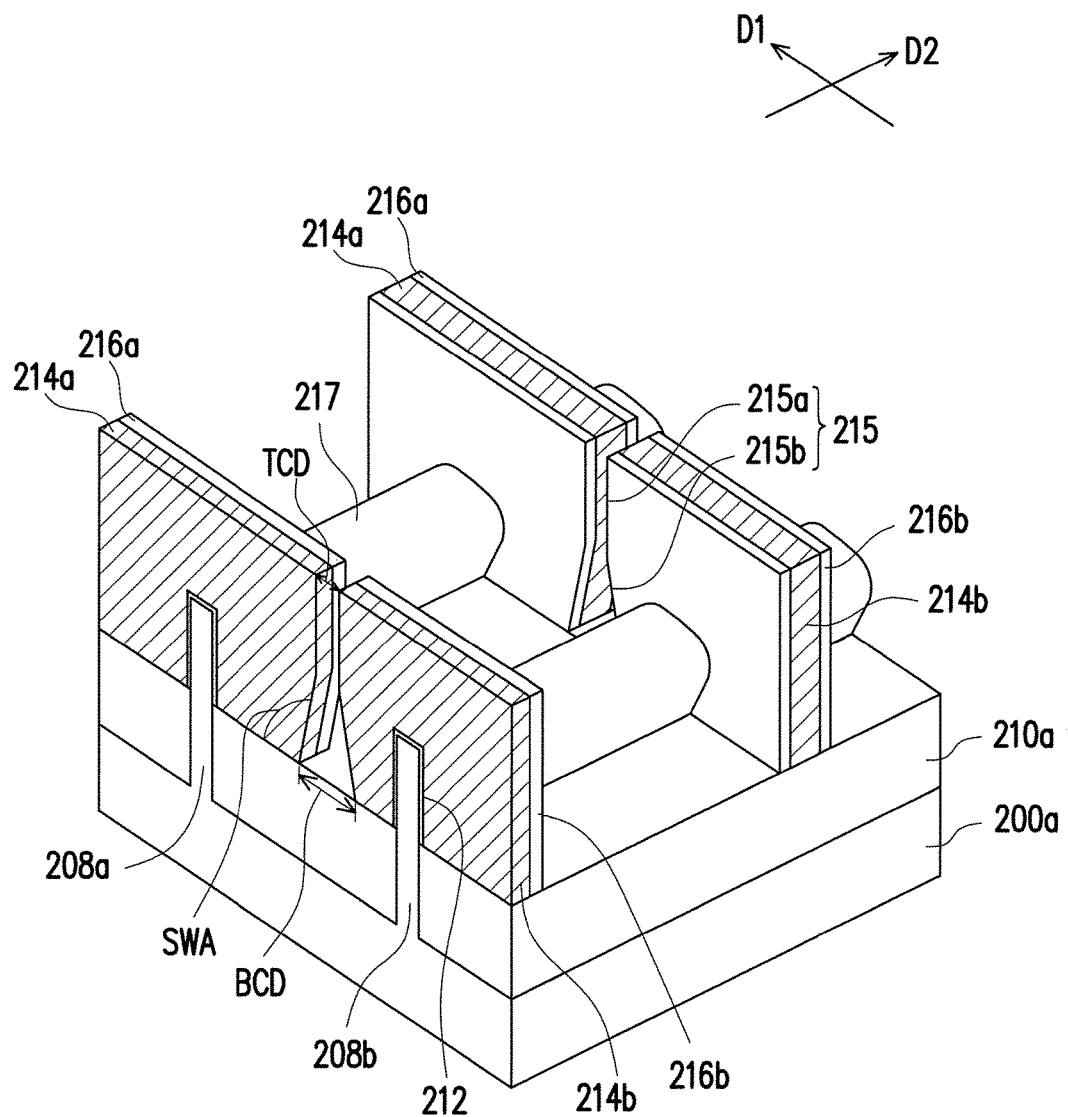

FIG. 2H is a perspective view of the FinFET at one of various stages of the fabricating method. In Step S30 in FIG. 1 and as shown in FIGS. 2G-2H, a portion of the dummy gate strip 214 is removed to form an opening 215, and the remained dummy gate strip 214 is divided into a first dummy gate 214a and a second dummy gate 214b by the opening 215 therebetween. In some embodiments, a distance between the opening 215 and the first dummy gate 214a is equal to a distance between the opening 215 and the second dummy gate 214b. In alternative embodiments, a distance between the opening 215 and the first dummy gate 214a may be different from a distance between the opening 215 and the second dummy gate 214b. In some embodiments, a portion of the spacers 216 is also removed when forming the opening 215, and thus the remained spacers 216 is divided into spacers 216a and spacers 216b by the opening 215 therebetween. In some embodiments, the first dummy gate 214a and the second dummy gate 214b are formed on the first semiconductor fin 208a and the second semiconductor fin 208b respectively, and the opening 215 is disposed on the insulator 210a and between the first dummy gate 214a and the second dummy gate 214b. In some embodiments, along the lengthwise direction D1, a top critical dimension TCD of the opening 215 may be different from a bottom critical dimension BCD of the opening 215. For example, the top critical dimension TCD of the opening 215 is smaller than the bottom critical dimension BCD of the opening 215. In some embodiments, the top critical dimension TCD and the bottom critical dimension BCD of the opening 215 range from 5 nm to 500 nm. In some embodiments, the top portion 215a of the sidewalls of the opening 215 is substantially straight, and the bottom portion 215b of the sidewalls of the opening 215 is inclined. In some embodiments, a height of the top portion 215a is smaller than a height of the bottom portion 215b. In some embodiments, the height of the top portion 215a to the height of the bottom portion 215b ranges from 1 to 8. In some embodiments, an included angle SWA formed between the sidewalls of the opening 215 and the insulator 210a is, for example, larger than 90 degrees. The opening 215 may be formed by an etching process. The process forming the first dummy gate 214a and the second dummy gate 214b by cutting the dummy gate strip 214 is also referred to an end cut process, and end of the formed first dummy gate 214a is adjacent to one end of the formed second dummy gate 214b. In some embodiments, an aspect ratio of the opening 215 ranges from 7 to 10.

In some embodiments, source/drain regions 217 are formed at two opposite sides of the first dummy gate 214a and the second dummy gate 214b. In some embodiments, the exposed upper portions of the first and second semiconductor fins 208a, 208b are removed by using a suitable technique such as an anisotropic etching process, and therefore, recesses (not shown) are formed in the insulator 210a. In some embodiments, the exposed upper portions of the first and second semiconductor fins 208a, 208b are removed by using the first dummy gate 214a, the second dummy gate 214b, the spacers 216a, and the spacers 216b as an etch mask. That is, the step of forming the recesses is considered a self-aligned etching step. In some embodiments, an enlarging step and/or a rounding step can be included after the recess forming step, so the resulting recess profile can have a diamond-like shape, a bucket-like shape or the like.

Thereafter, the source/drain regions 217 are formed by selectively growing epitaxy layers from the recesses. Specifically, the source/drain regions 217 are formed within recesses and extend upwardly along the sidewalls of the corresponding spacers 110. In some embodiments, the source/drain regions 217 include silicon germanium, silicon carbon or silicon phosphate. In some embodiments, the source/drain regions 217 include silicon germanium (SiGe) for a P-type FinFET device. In alternative embodiments, the source/drain regions 217 include silicon carbon (SiC), silicon phosphate (SiP), SiCP or a SiC/SiP multi-layer structure for an N-type FinFET device. In some embodiments, the source/drain regions 217 may be optionally implanted with an N-type dopant or a P-type dopant as needed. In some embodiments, the adjacent source/drain regions 217 at the same side are separate from each other, as shown in FIG. 2H. In alternative embodiments, the adjacent source/drain regions 217 at the same side are connected. Following the formation of the source/drain regions 217, silicide regions may be formed by siliciding the top portions of the source/drain regions 217.

Figure 2I:
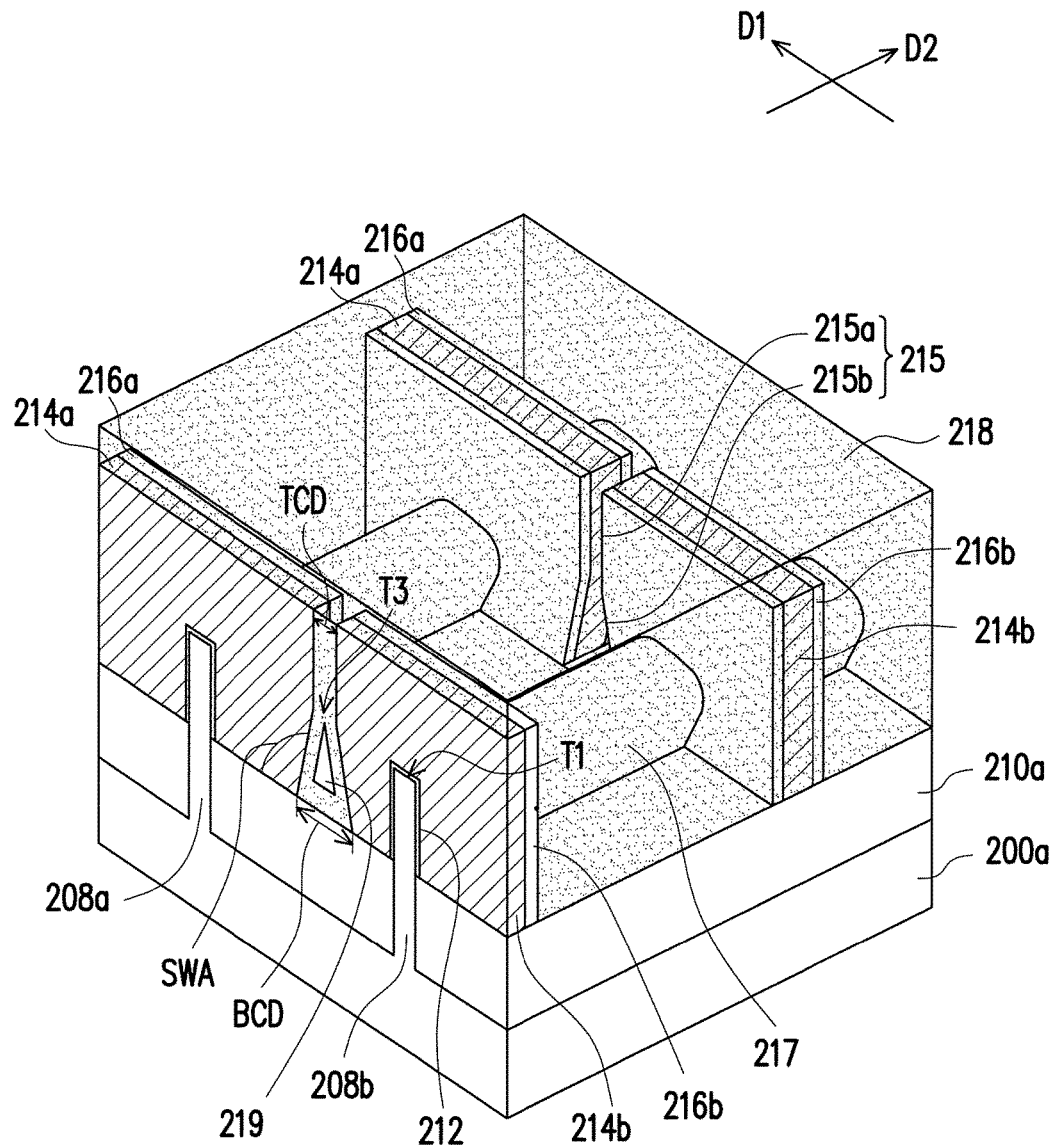

FIG. 2I is a perspective view of the FinFET at one of various stages of the fabricating method. In Step S40 in FIG. 1 and as shown in FIGS. 2H-2I, a dielectric material 218 fills in the opening 215 and forms with an air gap 219 therein. In some embodiments, the dielectric material 218 is formed over the substrate 200a to fill in the opening 215 and cover the first dummy gate 214a and the second dummy gate 214b. The dielectric material 218 may include silicon oxide, silicon nitride, silicon oxynitride, or a low-K dielectric material. The dielectric material 218 formed with the air gap 219 therein may be formed by chemical vapor deposition (CVD) or physical vapor deposition (PVD). In some embodiments, the air gap 219 is formed simultaneously with the dielectric material 218. In some embodiments, a top surface T3 of the air gap 219 is substantially lower than top surfaces T1 of the first semiconductor fin 208a and the second semiconductor fin 208b. In some embodiments, before the dielectric material 218 is formed, some processes (e.g. removal process of dielectric layer covering the insulator 210a, fin recessing process, strained source/drain epitaxial process on the semiconductor fins, silicidation process and so on) may be performed in advance. Details of the aforesaid processes are omitted. In some embodiments, triangle is utilized as example to illustrate the air gap 219, however, it is not intended to limit the shape of the air gap 219. For example, the air gap 219 may be form in circle, ellipse, or other irregular shapes. Furthermore, one air gap 219 in the dielectric material 218 shown in FIG. 2I is merely for illustration, in alternative embodiments, two or more air gaps 219 may be formed in accordance with actual design requirements.

Figure 2J:
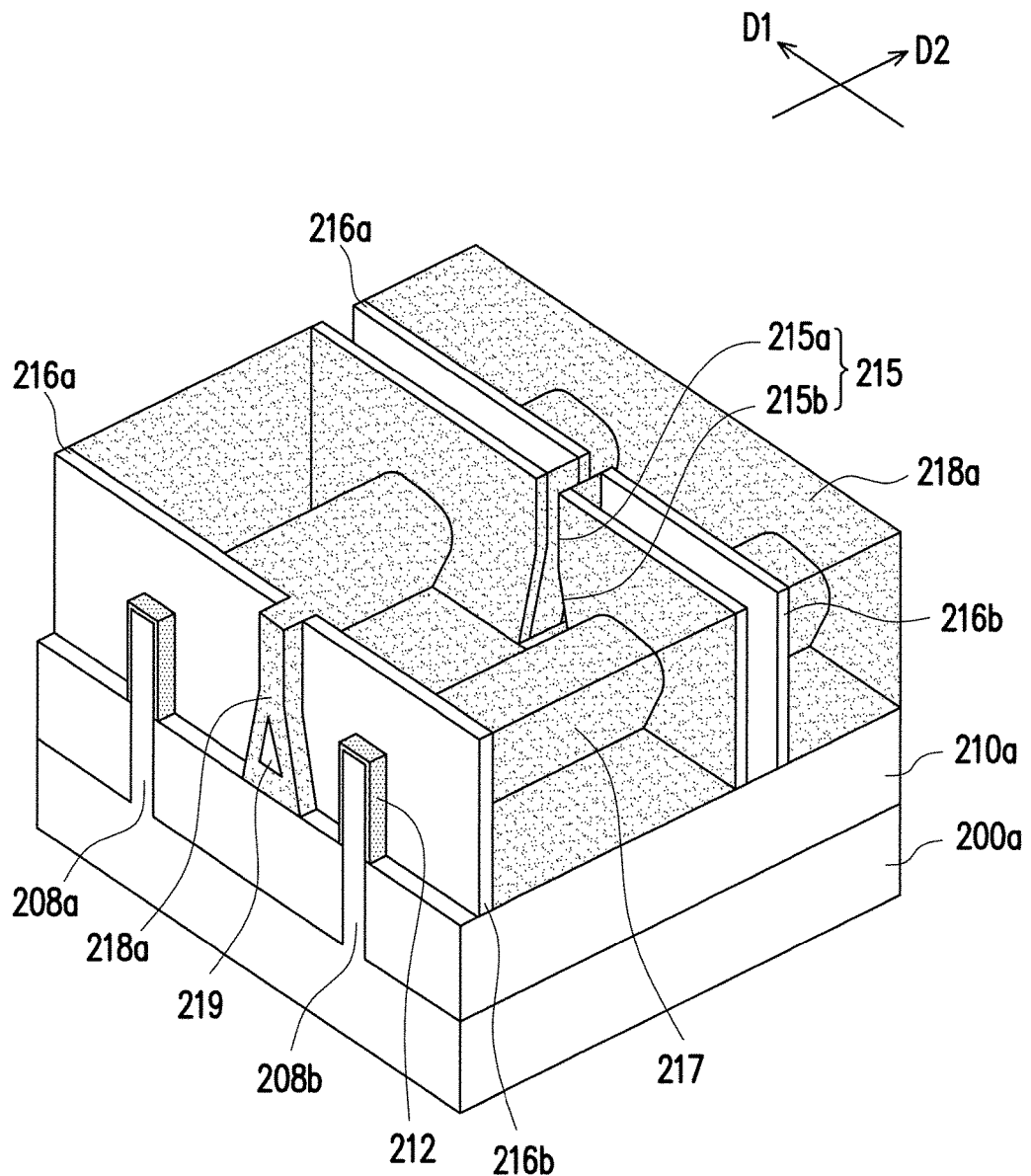

FIG. 2J is a view of the FinFET at one of various stages of the fabricating method. In Steps S40 and S50, in FIG. 1 and as shown in FIGS. 2I-2J, a portion of the dielectric material 218 is removed to form the dielectric layer 218a and expose the first dummy gate 214a and the second dummy gate 214b. In some embodiments, a polish process such as chemical mechanical polish process is, for example, performed to remove a portion of the dielectric material 218, a portion of the first dummy gate 214a, and a portion of the second dummy gate 214b. In alternative embodiments, a polish process is performed to remove a portion of the dielectric material 218 until the first dummy gate 214a and the second dummy gate 214b are exposed. The removal of the portion of the dielectric material 218 does not expose the air gap 219. In other word, the air gap 219 is remained in the dielectric layer 218a.

Then, the remained first dummy gate 214a and the remained second dummy gate 214b are removed. In some embodiments, the first dummy gate 214a and the second dummy gate 214b are removed, for example, by an etching process. Through properly selecting of etchant, the first dummy gate 214a and the second dummy gate 214b are removed without damaging the dielectric layer 218a and the dielectric layer 212 significantly.

Figure 2K:
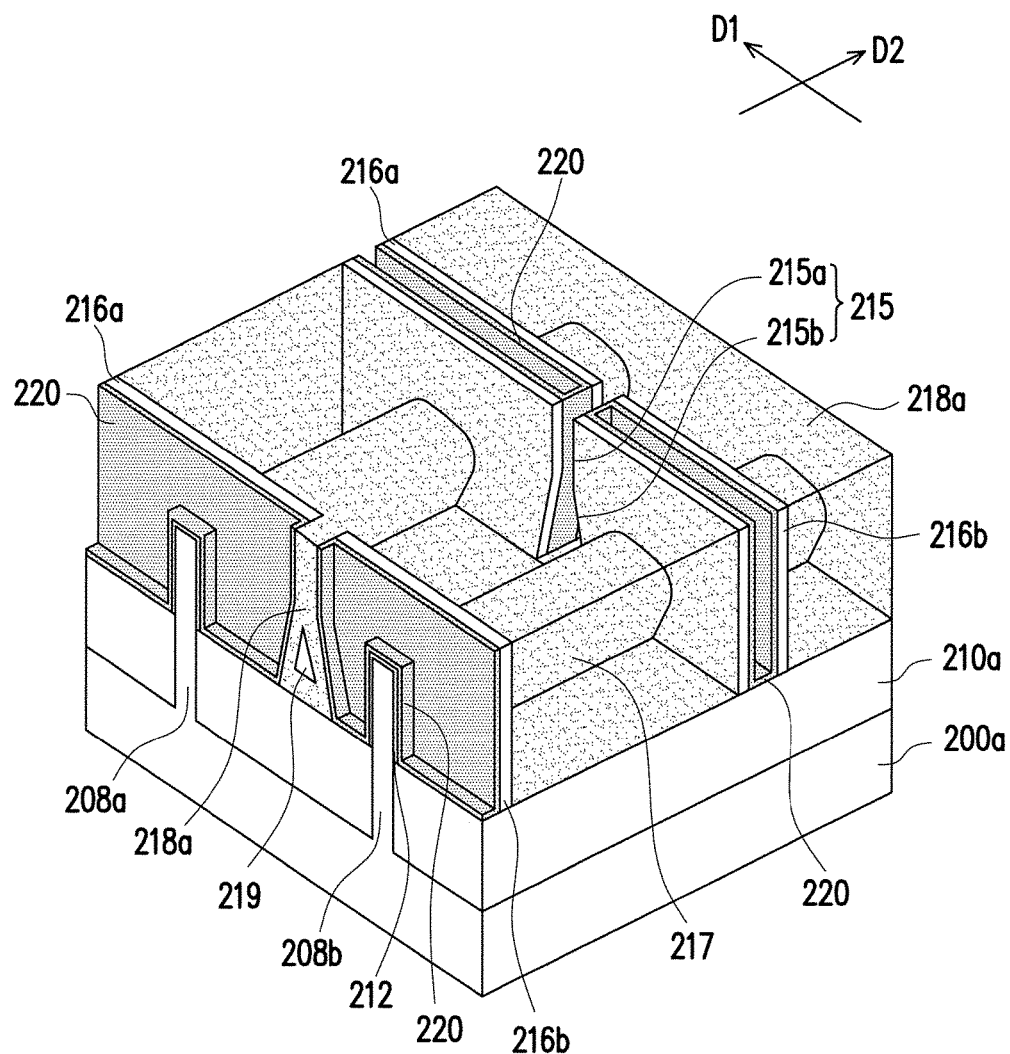

FIG. 2K is a view of the FinFET at one of various stages of the fabricating method. In Step S50, in FIG. 1 and as shown in FIGS. 2J-2K, a gate dielectric layer 220 is formed over the dielectric layer 212 covering the first semiconductor fin 208a and the second semiconductor fin 208b, the insulator 210a and sidewalls SW of the dielectric layer 218a. In some embodiments, the gate dielectric layer 220 may include a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, the gate dielectric layer 110 can optionally include a silicate such as HfSiO, LaSiO, AlSiO, a combination thereof, or a suitable material. In some embodiments, the gate dielectric layer 220 has a thickness in the range of about 5 nm to 50 nm. The gate dielectric layer 220 may be formed by a suitable process such as thermal oxidation. The gate dielectric layer 220 is, for example, thicker than the dielectric layer 212.

Figure 2L:
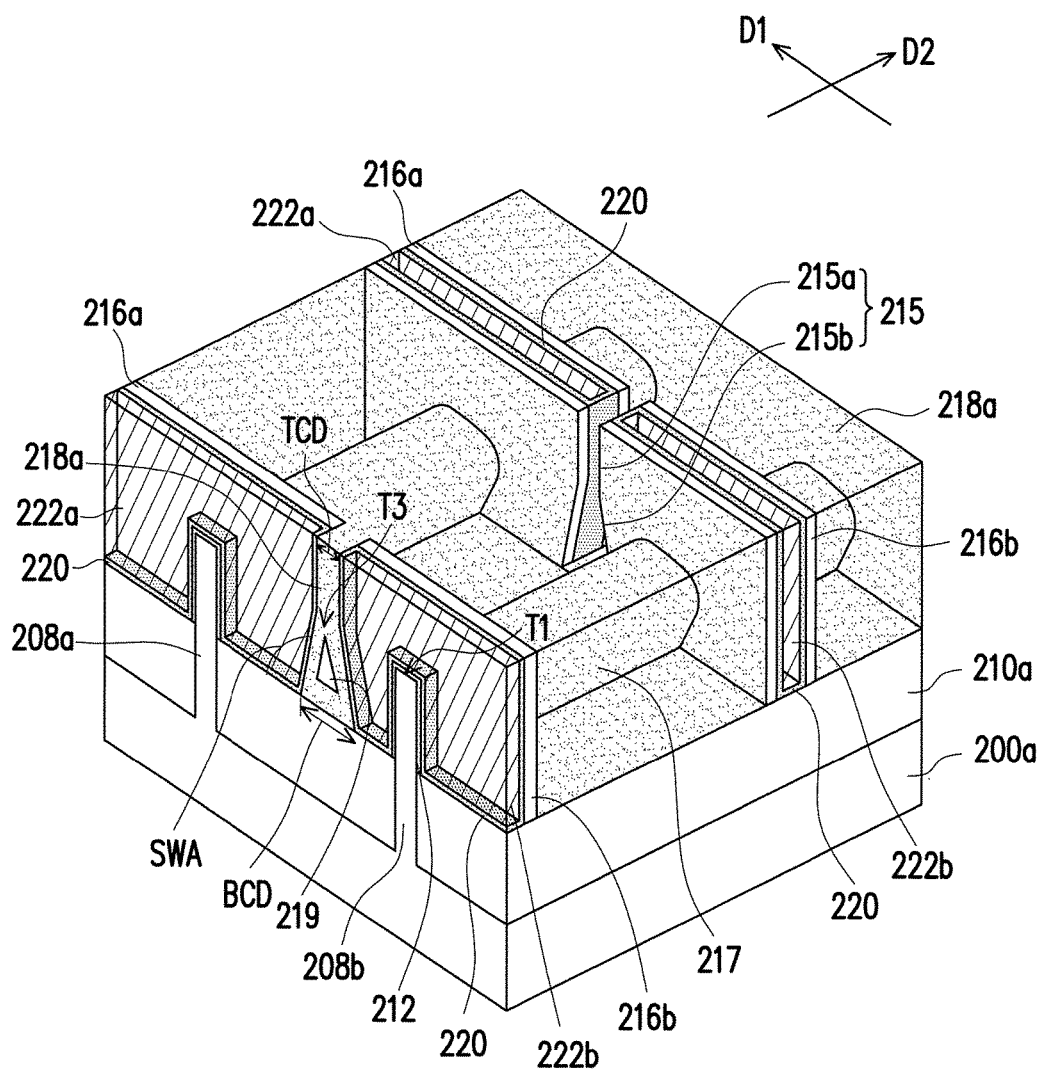

FIG. 2L is a view of the FinFET at one of various stages of the fabricating method. In Step S50, in FIG. 1 and as shown in FIGS. 2K-2L, a first gate 222a and a second gate 222b are formed to cover the gate dielectric layer 220. The gate dielectric layer 220 is disposed between the first gate 222a and the first semiconductor fin 208a and the second gate 222b and the second semiconductor fin 208b. In some embodiments, the first gate 222a and the second gate 222b may include a single layer or multi-layered structure. In some embodiments, the first gate 222a and the second gate 222b may include metal, such as Al, Cu, W, Ti, Ta, TiN, TiAl, TiAlN, TaN, NiSi, CoSi, other conductive materials with a work function compatible with the substrate material, or combinations thereof. In some embodiments, a thickness of the first gate 222a and the second gate 222b is, for example, in the range of about 30 nm to about 60 nm. The first gate 222a and the second gate 222b may be formed by a suitable process such as ALD, CVD, PVD, plating, or combinations thereof.

In some embodiments, the width of the first gate 222a ranges from 5 nm to 50 nm, and the width of the second gate 222b ranges from 5 nm to 50 nm. The portion of the first semiconductor fin 208a that is overlapped with and covered by the first gate 222a serves as a channel of a FinFET; and the portion of the second semiconductor fin 208b that is overlapped with and covered by the second gate 222b serves as a channel of a FinFET.

In some embodiments, the dielectric layer 218a is formed with the air gap 219 having a dielectric constant lower than the dielectric material 218. Accordingly, the total dielectric constant of the dielectric layer 218a is reduced, and parasitic capacitance formed between the first gate 222a and the second gate 222b is prevented. Therefore, the dimension of the dielectric layer 218a between the first gate 222a and the second gate 222b may be reduced, and the process window of the end cut process is enlarged.

Figure 3:
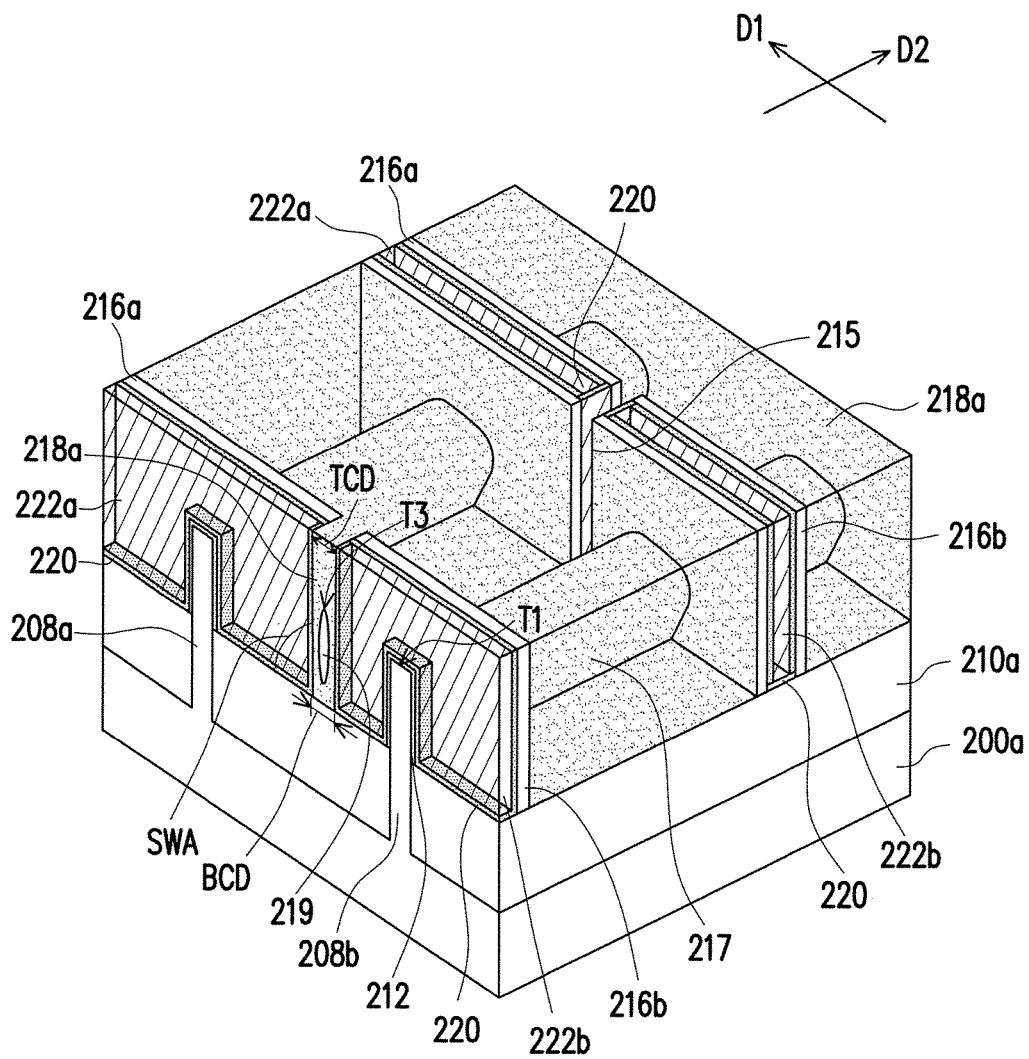
FIG. 3 is a perspective view of a FinFET according to some embodiments of the disclosure.

FIG. 3 is a perspective view of the FinFET according to some embodiments of the disclosure. The FinFET provided in the present embodiment is similar to the FinFET depicted in FIG. 2L, and therefore, identical elements in these figures will be denoted with the same numerals and will not be described repeatedly hereinafter. The difference between the two embodiments lies in that, in the present embodiment, the top critical dimension of the opening between the first gate and the second gate is substantially equal to the bottom critical dimension thereof. Referring to FIG. 3, the top critical dimension TCD of the opening 215 is substantially equal to the bottom critical dimension BCD of the opening 215, and thus the top critical dimension of the dielectric layer 218a is substantially equal to the bottom critical dimension of the dielectric layer 218a. In some embodiments, the top critical dimension TCD and the bottom critical dimension BCD of the opening 215 range from 5 nm to 500 nm. In some embodiments, an included angle SWA formed between the sidewalls of the opening 215 and the insulator 210a is, for example, substantially equal to 90 degrees. In some embodiments, the sidewalls of the opening 215 are straight, for example. In some embodiments, the dielectric layer 218a is formed with the air gap 219. Accordingly, the dielectric constant of the dielectric layer 218a is reduced, and provides good insulation for the first gate 222a and the second gate 222b. In some embodiments, material and forming method of the dielectric layer 218a are similar to those of the dielectric layer 218a depicted in FIG. 2I, and thus it is not repeated here.

In some embodiments, the dielectric layer having at least one air gap is formed between the first gate and the second gate. Since the air has a dielectric constant lower than the dielectric material, the dielectric layer including the air gap has a total dielectric constant lower than the dielectric material. Therefore, the dielectric layer prevents parasitic capacitance formed between the first gate and the second gate. Accordingly, the dimension of the dielectric layer between the first gate and the second gate may be reduced, and the dimensions of the first gate and the second gate may be enlarged. Furthermore, the line-end bridge defect and the leakage are prevented, and yield and reliability of the FinFET are enhanced.

In accordance with some embodiments of the present disclosure, a method for fabricating a fin field effect transistor (FinFET) is provided. A first semiconductor fin, a second semiconductor fin and an insulator between the first semiconductor fin and the second semiconductor fin are formed. A first dummy gate, a second dummy gate and an opening between the first and second dummy gates are formed over the insulator, wherein the first dummy gate and the second dummy gate cross over portions of the first semiconductor fin and the second semiconductor fin respectively. A dielectric layer is formed in the opening, wherein the dielectric layer comprises an air gap therein. The first dummy gate and the second dummy gate are replaced with a first gate and a second gate, wherein the first gate and the second gate are electrically insulated by the dielectric layer comprising the air gap therein.

In accordance with alternative embodiments of the present disclosure, a method for fabricating a fin field effect transistor (FinFET) is provided. A first semiconductor fin, a second semiconductor fin and an insulator between the first semiconductor fin and the second semiconductor fin are formed. A dummy gate strip is formed over the insulator to cross over portions of the first semiconductor fin and the second semiconductor fin. A portion of the dummy gate strip is removed to form an opening, wherein the opening is disposed between the first semiconductor fin and the second semiconductor fin and a top critical dimension of the opening is smaller than a bottom critical dimension of the opening. A dielectric layer is filled in the opening, wherein an air gap is formed in the dielectric layer simultaneously during filling the dielectric layer in the opening. The remained dummy gate strip is removed. A first gate and a second gate are formed to cross over the first semiconductor fin and the second semiconductor fin respectively, wherein the first gate and the second gate are electrically insulated by the dielectric layer comprising the air gap therein.

In accordance with yet alternative embodiments of the present disclosure, a method for fabricating a fin field effect transistor (FinFET) is provided. A substrate is patterned to form a first semiconductor fin, a second semiconductor fin and a trench between the first semiconductor fin and the second semiconductor fin. An insulator is formed in the trench. A dummy gate strip is formed over the insulator to cross over portions of the first semiconductor fin and the second semiconductor fin. An opening is formed in the dummy gate strip, so as to separate the dummy gate strip into a first dummy gate and a second dummy gate on the first semiconductor fin and the second semiconductor fin respectively. A first dielectric layer is formed in the opening, wherein the dielectric layer is a single layer and the first dielectric layer is formed with an air gap therein. The first dummy gate and the second dummy gate are replaced with a first gate and a second gate respectively, wherein the first gate and the second gate are electrically insulated by the first dielectric layer comprising the air gap therein, and a bottom of the air gap is higher than a bottom of at least one of the first gate and the second gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a fin field effect transistor (FinFET), comprising:
   forming a first semiconductor fin, a second semiconductor fin and an insulator between the first and second semiconductor fins;
   forming a dummy gate strip over the insulator to cross over portions of the first semiconductor fin and the second semiconductor fin;
   forming an opening in the dummy gate strip; and
   forming a dielectric layer in the opening, wherein an air gap is formed in the dielectric layer when the dielectric layer is formed in the opening.

2. The method of claim 1, wherein the insulator is formed between lower portions of the first and second semiconductor fins, and the dummy gate strip surrounds upper portions of the first semiconductor fin and the second semiconductor fin respectively.

3. The method of claim 1, wherein a bottom surface of the air gap is higher than a bottom surface of the dummy gate strip.

4. The method of claim 1, wherein a top critical dimension of the opening is smaller than or substantially equal to a bottom critical dimension of the dielectric layer.

5. The method of claim 1, wherein the dielectric layer is further formed over the first and second semiconductor fins.

6. A method for fabricating a fin field effect transistor (FinFET), comprising:
   forming a first semiconductor fin, a second semiconductor fin and an insulator between the first semiconductor fin and the second semiconductor fin;
   forming a dummy gate strip over the insulator to cross over portions of the first semiconductor fin and the second semiconductor fin;
   cutting the dummy gate strip to form a first dummy gate, a second dummy gate and an opening, wherein an end of the first dummy gate is adjacent to an end of the second dummy gate, and the opening is an end-to-end opening between the end of the first dummy gate and the end of the second dummy gate;
   filling a dielectric layer in the opening, wherein an air gap is formed in the dielectric layer simultaneously during filling the dielectric layer in the opening;
   removing the first dummy gate and a second dummy gate; and
   forming a first gate and a second gate to cross over the first semiconductor fin and the second semiconductor fin respectively, wherein the first gate and the second gate are electrically insulated by the dielectric layer comprising the air gap therein.

7. The method of claim 6, wherein the opening includes a top portion and a bottom portion, the top portion has straight sidewalls, and the bottom portion has inclined sidewalls.

8. The method of claim 6, wherein a bottom surface of the air gap is higher than a bottom surface of at least one of the first gate and the second gate.

9. A method for fabricating a fin field effect transistor (FinFET), comprising:
   patterning a substrate to form a first semiconductor fin, a second semiconductor fin and a trench between the first semiconductor fin and the second semiconductor fin;
   forming an insulator in the trench;
   forming a dummy gate strip over the insulator to cross over portions of the first semiconductor fin and the second semiconductor fin;
   forming an opening in the dummy gate strip, so as to separate the dummy gate strip into a first dummy gate and a second dummy gate on the first semiconductor fin and the second semiconductor fin respectively;
   forming a dielectric material to fill in the opening and cover the first dummy gate and the second dummy gate, wherein the air gap is formed simultaneously with the dielectric material;
   removing a portion of the dielectric material to form a first dielectric layer, wherein the air gap is retained in the first dielectric layer; and
   replacing the first dummy gate and the second dummy gate with a first gate and a second gate respectively, wherein the first gate and the second gate are electrically insulated by the first dielectric layer comprising the air gap therein, and a bottom of the air gap is higher than a bottom of at least one of the first gate and the second gate.

10. The method of claim 9, wherein the air gap is enclosed by the first dielectric layer.

11. The method of claim 9, wherein the opening is formed with a top critical dimension smaller than or substantially equal to a bottom critical dimension thereof.

12. The method of claim 9, wherein the opening includes a top portion and a bottom portion, the top portion has straight sidewalls, and the bottom portion has inclined sidewalls.

13. The method of claim 9, wherein a top surface of the first dielectric layer is substantially coplanar with top surfaces of the first and second dummy gates.

14. The method of claim 9 further comprising forming a second dielectric layer on the first and second semiconductor fins and sidewalls of the first dielectric layer after removing the first dummy gate and the second dummy gate.

15. The method of claim 14 further comprising forming a third dielectric layer disposed between the first semiconductor fin and the second dielectric layer and between the second semiconductor fin and the second dielectric layer.

16. The method of claim 1, wherein the air gap is enclosed by the dielectric layer.

17. The method of claim 1, wherein the opening divides the dummy gate strip into two parts.

18. The method of claim 6, wherein a top critical dimension of the opening is smaller than or substantially equal to a bottom critical dimension of the opening.

19. The method of claim 6, wherein the air gap is enclosed by the dielectric layer.

20. The method of claim 7, wherein the straight sidewalls are substantially perpendicular to an extended direction of the dummy gate strip and an extended direction of the first semiconductor fin.

* * * * *